United States Patent [19]

Wollmerschauser et al.

[11] Patent Number: 5,091,707

[45] Date of Patent: Feb. 25, 1992

[54] COAXIAL CABLE SHIELD FILTER

[76] Inventors: Steven M. Wollmerschauser, 10527 Wurdack, Overland, Mo. 63114; David M. Mundy, 1912 Falcon Dr., Hanley Hills, Mo. 63133

[21] Appl. No.: 566,661

[22] Filed: Aug. 13, 1990

[51] Int. Cl.$^5$ .......................... H04B 3/28; H03H 7/00
[52] U.S. Cl. ...................... 333/12; 333/181; 336/229
[58] Field of Search ............... 333/12, 167, 185, 184, 333/181; 336/229, 233

[56] References Cited

U.S. PATENT DOCUMENTS

| | | | |
|---|---|---|---|
| 3,913,038 | 10/1975 | Carter et al. | 333/167 |
| 4,267,529 | 5/1981 | Brun et al. | 333/12 |
| 4,543,554 | 9/1985 | Muellenheim et al. | 333/12 X |
| 4,845,447 | 7/1989 | Holdsworth | 333/12 X |
| 4,975,672 | 12/1990 | McLyman | 336/229 X |

FOREIGN PATENT DOCUMENTS 0117711  7/1983  Japan .................................. 333/181

Primary Examiner—Eugene R. LaRoche
Assistant Examiner—Seung Ham
Attorney, Agent, or Firm—Rogers, Howell & Haferkamp

[57] ABSTRACT

A coaxial cable shield filter for reducing RF signal interference from cable television lines is connected in series between a cable system coaxial cable and a television receiver. Each choke consists of a ferromagnetic toroidal core, with coaxial cable being wound about each toroidal core. The filter device attenuates secondary RF signals carried by the shielding of the coaxial cable that interfere with the primary signals carried by the cable's center conductor.

8 Claims, 1 Drawing Sheet

COAXIAL CABLE SHIELD FILTER

BACKGROUND OF THE INVENTION

1) Field of the Invention

The present invention relates to an apparatus that reduces cable television picture signal interference caused by external radio frequency (RF) signals picked up and carried by the shielding of a coaxial cable communicating with a television or video cassette recorder (VCR). The apparatus comprises a pair of RF signal chokes that are formed by wrapping a coaxial cable such as Belden 9308 mini-hardline coaxial cable which offers 100% shielding around a pair of ferrite toroidal cores. The apparatus filters from the coaxial cable shielding the undesired external RF signals that are picked up and transmitted on the shielding to the television or VCR tuner where they interfere with the cable system signals transmitted by the coaxial cable center conductor. The apparatus is provided in a compact housing with input and output connectors that is easily connected between a cable system coaxial cable extending from a wall outlet and a television or VCR receiver by a layperson not having the specialized training of a television technician.

2) Description of the Related Art

Cable television signals are often fuzzy and unclear to the viewer due to interference which is virtually impossible to eliminate. The interference is often caused by secondary, "off-air" radio frequency (RF) signals that are picked up by the shielding of the coaxial cable, which acts as an antenna. Often, the picture interference problems stem from the design of the television of the cable system subscriber, something over which the cable signal supplier has no control. The problem persists because television manufacturers continue to build televisions with tuners that are susceptible to RF signal interference. The television owner does not know what causes the problem, and so doesn't know who to turn to for its solution.

If the shielding of the coaxial cable or the internal shielding of a TV or VCR tuner connected to the coaxial cable is inadequate, the RF interference may be directly picked up and mixed with the cable system's primary signals carried by the center conductor of the coaxial cable. The mixing of the "off-air" RF signals with the cable system's primary signals interferes with the television's or VCR's reception of the primary signals. This is known as the direct pick up ("DPU") problem in the CATV industry. External "off-air" RF signals produced by sources such as local television stations, ham operators and beeper services cause picture interference when they mix with the desired CATV signals on the coaxial cable center conductor. If these external RF signals are conducted along the shielding of the coaxial cable to the television or VCR tuner and are allowed to enter the tuner where they can mix with the desired CATV signals carried on the coaxial cable center conductor, they will cause picture degradation such as ghosting or diagonal lines in the television picture.

Most televisions and video cassette recorders are manufactured with tuners that have small access holes in them. The holes are used in the factory to calibrate the tuner during assembly. However, manufacturers often leave the holes open after the tuner has been calibrated. When a cable system's coaxial cable is connected with a tuner having access holes, the external RF signals conducted on the shielding of the coaxial cable are communicated to the housing of the television tuner. From the housing, the RF signals then pass through the access holes and enter into the tuner where the tuner circuitry is located. Once inside the tuner, these undesired external RF signals mix with the CATV signals carried by the center conductor of the coaxial cable and reduce the quality of the picture produced by the television or VCR tuner.

Various methods and apparatus have been employed in the prior art to reduce external RF signals conducted on the shielding of coaxial cables. However, these methods are not commonly known within the CATV industry, are not easy to implement, and therefore are rarely used within the CATV industry. One method of attenuating RF signals conducted on the shielding of coaxial cables involves packing a cylindrical tube with steel wool, and then running the coaxial cable through the center of the steel wool packed in the tube. The steel wool is lossy and dissipates the RF energy on the cable shield. To increase this device's effectiveness in attenuating RF signals, the tube should be 18 inches long or longer. A disadvantage of this method is that the long tube required to manufacture the apparatus is awkward and unsightly. A cable television subscriber would likely forego using this apparatus to improve his television or VCR reception because it requires the awkward, unsightly tube to be connected along the length of coaxial cable connecting a coaxial cable wall outlet with their television or VCR receiver. The large tube is difficult to conceal and the subscriber would likely be unwilling to have the tube visible in their home.

Another method employed in attenuating external RF signals conducted on the shielding of coaxial cable involves connecting a metal plate between the shielding of the length of coaxial cable communicating a coaxial cable wall outlet with a television or VCR receiver. For VHF television channel 2, the smallest effective metal plate is a 9 foot diameter circle. The required size of the plate decreases linearly with frequency. However, a common cable television subscriber would likely be opposed to having a metal plate of this size connected in the coaxial cable communicating his television or VCR with the coaxial cable wall outlet in his home. Also, the TV owner would need a different sized plate for each channel frequency that he desires to filter.

A third method employed to attenuate external RF signals conducted on the shielding of coaxial cable involves winding the cable on a ferrite toroid. Although the cable extending from a typical wall outlet to a TV or VCR is flexible, no provision is made for securing the toroid adjacent to the TV so as to maximize its effectiveness. Furthermore, as with the previously-described prior art apparatus, a toroid wrapped with a connection cord would be awkward and unsightly, and the coils wound around the toroid would be likely to unwind each time the cable is disconnected from the television.

Besides the disadvantages of the large size and unsightly appearance of the prior art apparatus discussed above, each of the apparatus are also disadvantaged in that they are not commercially available and their existence is not common knowledge of the layperson cable television subscriber. The above-described jerry-built apparatus are generally known to only a few cable television technicians having specialized knowledge of external RF signals and the problems they cause to television reception. At present, for a common cable television subscriber to improve the picture reception of their television or VCR connected with a cable system's coaxial cable, the layperson would have to call a technician into their home and explain the problem to the technician, and then the technician would have to have the requisite knowledge to identify the problem as external RF signal interference. The technician would also have to have the requisite knowledge to remedy the problem by constructing from scratch one of the above-identified RF signal attenuating apparatus. This is unlikely to occur as these apparatus are not widely known in the cable television industry. The layperson cable subscriber would then have to be resigned to put up with the awkward and unsightly signal attenuating apparatus in their home in order to improve his cable television picture reception.

At present, cable television technicians often attempt to solve the problem of RF signal interference by connecting a standard cable converter box to the coaxial cable suppplying signals to the television in the hope that this will solve the problem. However, the converter boxes are often ineffective as shield filters and connecting the box to a cable ready television defeats the cable ready capability of the television.

What is needed to overcome the above-described RF signal television picture interference and the disadvantages associated with known RF signal attenuation apparatus is a commercially available, compact external RF signal filter apparatus that can be readily and easily connected by a layperson between the coaxial cable extending from the wall outlet of the layperson's home and their television or VCR.

It is an object of the present invention to provide a method for an unskilled layperson to attenuate television picture interference caused by secondary "off-air" RF signals carried on the shielding layer of a cable system's coaxial cable.

It is also an object of the present invention to provide an inexpensive compact apparatus that is easily connected by a layperson between a length of coaxial cable leading from a cable system wall socket and a television or VCR receiver, and that filters "off-air" RF signals carried on the shielding layer of the coaxial cable.

A further object of the present invention is to provide an apparatus that filters cable signals that leak out of a television tuner and travel on the coaxial cable shield or leak into the air where they interfere with aircraft navigation and communication, television "off-air" signals and radio communications.

It is also an object of the present invention to provide a filtering apparatus having a simplified construction that enables a layperson having no specialized skills to connect the filter closely adjacent to a television or VCR receiver.

SUMMARY OF THE INVENTION

The coaxial cable shield filter of the present invention is generally comprised of a housing containing a filter device that attenuates the "off-air" RF signals carried by coaxial cable shielding. The housing has a removable cover that is attached to the housing by four threaded fasteners. The threaded fasteners are received into pre-drilled holes in the interior of the housing. A pair of coaxial cable connectors are mounted on the housing exterior and extend into the interior of the housing. One connector of the pair is a male threaded coaxial cable connector and the other connector is a female threaded coaxial cable connector. The filter device is comprised of two ferromagnetic toroids secured in the housing interior by epoxy or other equivalent fastening means. A length of a coaxial conductor is individually wrapped several times around each of the two toroids to create a pair of chokes. The chokes are arranged in series along the coaxial conductor. The opposite ends of the conductor are conducted to the male and female coaxial cable connectors mounted to the housing exterior.

In use, the shield filter is connected between a cable system coaxial cable and a television or VCR receiver at the female and male connectors of the filter. This simplified connection of the filter between the coaxial cable and the television or VCR receiver is easily accomplished by a layperson and does not require the specialized skills of a television or cable system technician. To complete the connection, the layperson first disconnects the length of coaxial cable leading from a coaxial cable wall socket from its connection to the television or VCR receiver. The layperson then screw threads the free end of the coaxial cable onto the female threaded coaxial cable connector of the filter. The layperson then threads the male threaded coaxial cable connector of the filter directly to the coaxial cable input of the television or VCR receiver. Any length of cable connected between the filter and the television or VCR will not be filtered by the filter and could act as an antenna and pick up external RF signals on its shielding and conduct the signals to the tuner of the television or VCR. It is therefore preferable that the filter be connected directly to the coaxial cable input of the television or VCR.

By connecting the filter between the coaxial cable and television or VCR as described above, the pair of signal chokes which serve as the filtering means of the filter are connected in series with the shielding of the coaxial cable and the tuner of the television or VCR receiver. The chokes act as filters that attenuate undesired "off-air" RF signals carried by the outer shield of the coaxial cable before the signals reach the tuner of the television or VCR. Conversely, any signals leaking out of the tuner and carried by the cable shield are also attenuated. The amount of cable signal leakage from television tuners is strictly regulated by the Federal Communication Commission ("FCC"). When these signals leak into the air, they can cause interference to aircraft navigation and other RF communication devices. Also, they can cause interference to radio communications and to non-subscribers of cable TV by being picked up on television antennas. The filter of the present invention aids in maintaining signal leakage within prescribed FCC limits.

DETAILED DESCRIPTION OF THE PREFERRED EMBODIMENT

Figure 2:
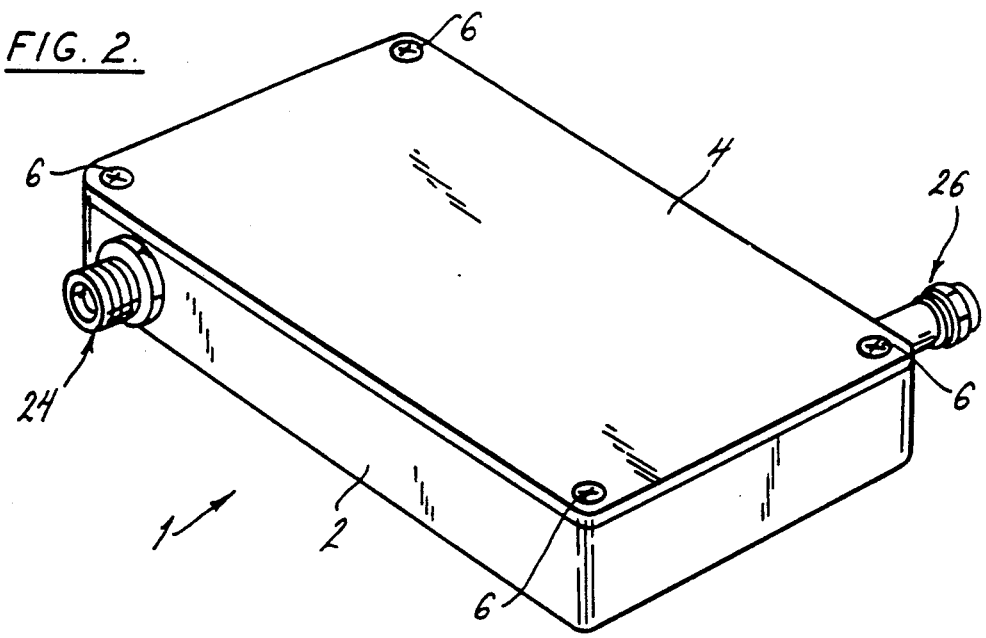
FIG. 2 is a perspective view of the filter housing of the present invention.
Figure 1:
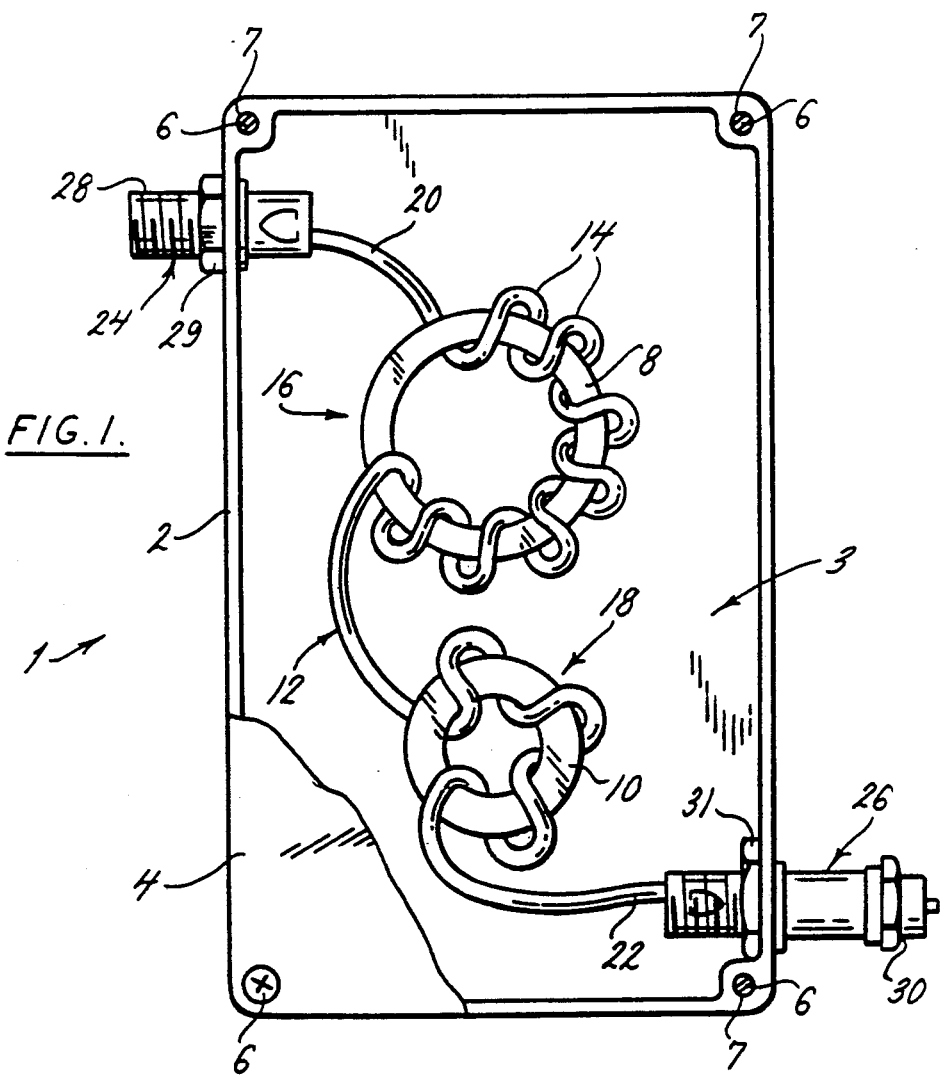
FIG. 1 is a partially cut-away, top view of the present invention.

As shown in FIG. 1, the coaxial cable shield filter 1 includes a housing having an exterior surface 2 and an interior 3. The interior is enclosed by a removable cover 4. The cover is secured in place by four threaded fasteners 6 that are received in four fastener mounts 7 in the housing interior 3.

Secured in the housing interior 3 is a first toroid 8 consisting of ferrite #43 and a second toroid 10 consisting of powdered iron. In the preferred embodiment of the invention, the two toroids 8, 10 are secured in the housing interior by an epoxy material (not shown). However, the two toroids 8, 10 may be secured in the housing by any other equivalent means. Wrapped around the first toroid 8 is a mini-hardline coaxial conductor 12. The coils 14 of conductor 12 wrapped around the toroid form a first coaxial choke 16 of the filter. The first choke 16 functions as an inductor connected in series with the coaxial conductor shielding. The same conductor cable 12 is then wrapped around the second toroid 10 to form a second coaxial choke 18 of the filter. The second choke 18 also acts as an inductor connected in series with the coaxial conductor shielding.

The coaxial conductor 12 has two opposite ends 20, 22 that extend from the first and second chokes 16, 18 respectively. The first conductor end 20 is connected with an input connector 24 and the second conductor end 22 is connected with an output connector 26. The input connector 24 has an exterior threaded coaxial female fitting 28 that attaches to a coaxial cable, transmitting a cable system (CATV) signal. The coaxial female connector 28 is mounted in a hole (not shown) that extends through the exterior housing surface 2, and is held in place by a threaded nut 29. The output connector 26 has an interior threaded coaxial male fitting 30. The male connector may be attached to a short length of coaxial cable that transmits the filtered cable signal to the television or VCR. However, it is preferred that the male connector be attached directly to the television or VCR itself. The male connector 30 is mounted in a second hole (not shown) that extends through the exterior housing surface 2, and is held in place by a second threaded nut 31. The connections between the female and male connectors of the filter and the coaxial cable and television or VCR receiver are easily made by a layperson and require no specialized technical skills. With the above-described simplified construction of the coaxial cable shield filter of the present invention, a layperson can connect the filter to their television or VCR themselves and it is not necessary to call on a television or cable system technician to install the filter.

The first and second chokes 16, 18 formed by winding the length of coaxial conductor 12 around the first toroid 8 and the second toroid 10 respectively, function as two inductors connected in series in a circuit formed by the shielding of the coaxial conductor 12 connected between the female 24 and male 26 coaxial cable connectors of the filter.

The secondary "off-air" RF signals picked up by the cable system coaxial cable are transmitted or carried by the cable shielding as a current. This current flows to the filter of the present invention connected between the coaxial cable and a television or VCR recevier, and is transmitted to the shielding layer of the coaxial conductor 12 of the filter. As RF current carried by the conductor shielding flows through the first coaxial choke 16 and the second coaxial choke 18, the current flowing through the coils of the chokes creates an inductance in the conductor shield circuit. Because these chokes are connected in series with the shielding layer of the coaxial conductor, the inductance created by the separate chokes is added together to get the total inductance of the conductor shielding circuit. The inductance creates a counter electro-magnetic force that resists the flow of current on the conductor shielding. The counter electro-magnetic force opposes any current change in the circuit, and attenuates the undesired "off-air" RF signals that are carried on the shielding layer of the coaxial conductor 12.

By constructing the pair of toroids from ferrite #43 and powdered iron, the first choke tends to attenuate signals from the low to middle frequency band TV channels, and the second choke tends to attenuate signals in the high to very high frequency band. Therefore, the filter is effective throughout the entire CATV frequency band, while not affecting signals carried on the center conductor of the coaxial cable.

The attenuation of the undesired "off-air" RF signals carried on the coaxial cable shield reduces the level of television picture interference caused by the mixing of the "off-air" RF signals with the primary cable system signals carried on the center conductor of the coaxial cable. The toroids forming the chokes of the present invention have a reduced effect on the CATV signal carried by the inner conductor as it is electrically isolated from the shield by a dielectric, or the like (not shown), which is commonly used in coaxial cable for that purpose.

From the above description of the present invention, it can be seen that the coaxial cable shield filter provides an inexpensive method of attenuating television picture interference caused by "off-air" RF signals carried by the shielding of a coaxial cable connected to the television. The filter is capable of being easily connected between a cable system coaxial cable and a television receiver by a layperson not having any of the specialized skills of a television technician.

There are various changes and modifications which may be made to the invention as would be apparent to those skilled in the art. However, these changes or modifications are included in the teaching of the disclosure, and it is intended that the invention be limited only by the scope of the claims appended hereto.

What is claimed is:

1. A coaxial cable shield filter for use in attenuating "off-air" RF signals that are picked up and conducted by coaxial cable shielding, the filter comprising:
   a housing;
   an input connector mounted on the housing, and adapted to be connected with a coaxial cable;
   an output connector mounted on the housing, and adapted to be connected with a coaxial cable;
   an RF filter means in the housing interior; and
   a conductor in the housing interior connecting the RF filter means to the input connector and the output connector, and arranged to connect the RF filter means in series with the shielding of a coaxial cable connected to the input connector and the shielding of a coaxial cable connected to the output connector;
   the RF filter means includes a first toroid secured in the housing interior, the first toroid being constructed from ferromagnetic material;
   and the RF filter means further includes a second toroid secured in the housing interior, the conductor being wrapped several times through the first and second toroids.

2. The filter of claim 1, wherein:
   the second toroid secured in the housing interior is constructed of ferromagnetic material.

3. The filter of claim 2, wherein:
   the first toroid attenuates RF signals in a low to middle television frequency band and the second toroid attenuates RF signals in a high to very high television frequency band.

4. A filter for reducing television picture interference caused by RF signals conducted on a coaxial cable shielding, the filter comprising:
   a first and a second toroid;
   a coaxial conductor with first and second ends, and having a center conductor and a shielding surrounding the center conductor;
   said coaxial conductor being wound about said first and second toroids in series, thereby creating first and second chokes connected in series by the shielding of the coaxial conductor;
   an input means provided at the first end of the coaxial conductor, the input means being adapted to be connected to a coaxial cable by an unskilled layperson; and
   an output means provided at the second end of the coaxial conductor, the output means being adapted to be connected to a television receiver by an unskilled layperson.

5. The filter of claim 4 wherein:
   said input means is a threaded female coaxial cable connector and said output means is a threaded male coaxial cable connector.

6. The filter of claim 4 wherein:
   said first and second toroids are constructed of ferromagnetic material.

7. The filter of claim 6 wherein:
   said first toroid is constructed of ferrite number 43 and said second toroid is constructed of powdered iron.

8. The filter of claim 7 wherein:
   said first toroid attenuates RF signals in a low to middle television frequency band and said second toroid attenuates RF signals in a high to very high television frequency band.

* * * * *

UNITED STATES PATENT AND TRADEMARK OFFICE
CERTIFICATE OF CORRECTION

PATENT NO. : 5,091,707

DATED : Feb. 25, 1992

INVENTOR(S) : Steven M. Wollmershauser and David M. Mundy

It is certified that error appears in the above-identified patent and that said Letters Patent is hereby corrected as shown below:

On the title page: Item [19 & 76] Amend the name of the first named inventor to read: WOLLMERHAUSER (Both Occurrences)

Signed and Sealed this

Twenty-second Day of June, 1993

Attest:

MICHAEL K. KIRK

*Attesting Officer*     *Acting Commissioner of Patents and Trademarks*